United States Patent [19]
Smith et al.

[11] Patent Number: 6,122,167
[45] Date of Patent: Sep. 19, 2000

[54] INTEGRATED HYBRID COOLING WITH EMI SHIELDING FOR A PORTABLE COMPUTER

[75] Inventors: Russell Smith, Pflugerville; Mark B. Penniman; Todd Steigerwald, both of Austin, all of Tex.

[73] Assignee: Dell USA, L.P., Round Rock, Tex.

[21] Appl. No.: 09/088,814

[22] Filed: Jun. 2, 1998

[51] Int. Cl.[7] .............................. H05K 5/00; H05K 7/00; H05K 7/20; H05K 9/00; H05K 7/14
[52] U.S. Cl. .................. 361/687; 361/687; 361/688; 361/800; 361/816; 361/818; 361/819
[58] Field of Search ..................... 361/816, 818, 361/829, 687, 688, 800

[56] References Cited

U.S. PATENT DOCUMENTS

| | | |
|---|---|---|
| 4,675,783 | 6/1987 | Murase et al. . |
| 5,030,793 | 7/1991 | McCarthy . |
| 5,175,613 | 12/1992 | Barker, III et al. . |
| 5,185,691 | 2/1993 | Korinsky . |
| 5,568,360 | 10/1996 | Penniman et al. . |
| 5,715,139 | 2/1998 | Nakajima ............................ 361/683 |
| 5,740,013 | 4/1998 | Roesner et al. .................... 361/697 |
| 5,784,256 | 6/1998 | Nakamura et al. ................. 361/699 |

*Primary Examiner*—Leo P. Picard
*Assistant Examiner*—Tung Minh Bui
*Attorney, Agent, or Firm*—Haynes and Boone, LLP

[57] ABSTRACT

A computer system includes a motherboard mounted in a chassis. An EMI shield member is mounted on the motherboard. A processor module is connected to the motherboard and has peripheral edge contact with the EMI shield member. A cap member is mounted on the processor module and is engaged with the EMI shield member. A heat sink is connected to the cap member. A heat pipe has a first end attached to the cap member and a second end attached to the heat sink. A fan is mounted in the chassis adjacent the heat sink for drawing cooling air across the heat sink.

13 Claims, 4 Drawing Sheets

INTEGRATED HYBRID COOLING WITH EMI SHIELDING FOR A PORTABLE COMPUTER

BACKGROUND

The disclosures herein relate generally to electromagnetic shielding and heat dissipation and more particularly to an integrated system for providing both electromagnetic shielding and heat dissipation for integrated circuits in a portable computer system.

A portable computer is a self-contained personal computer which can be easily moved to and operated at various locations. Portable computers are often referred to as laptop or notebook computers. To be portable, these computers must be small, compact, and lightweight. The conventional portable computer includes a base portion and a lid portion that pivotally opens from the base portion when the portable computer is in use. The lid portion contains a flat panel display such as a liquid crystal display (LCD) or other relatively small display.

Notebook computers incorporate electromagnetic shielding to reduce electromagnetic emissions in order to meet regulatory standards on such emissions. Portable computers also use thermal transfer mechanisms (heat-sinks or heat spreaders) to cool the CPU which accounts for almost half the power dissipated within the computer system.

An electromagnetic interference (EMI) shield is typically a metallic partition placed between two regions of space. The EMI shield controls the propagation of electric and magnetic fields from one of the regions to the other. An EMI shield may be used to contain electromagnetic fields if the shield surrounds the source of the electromagnetic fields. Many different sources of EMI noise are present in today's computer systems. Typically several mechanisms contribute to the total radiated EMI emissions from a computer system. Within a typical multi-layer Printed Wiring Board (PWB), circuit traces, internal power planes, and the integrated circuits attached to the PWB all have some contributory effect on radiated EMI emissions.

Between typical multi-layer PWBs exists another source of a computer system's total radiated EMI emissions, in which two different PWB structures at two different radio frequency (RF) potentials or different RF phase angles create a coplanar dipole antenna arrangement. The two or more PWBs radiate RF energy with respect to one another, creating multiple lobe electromagnetic waves into surrounding space. The RF voltage source which feeds each of the PWBs with the energy to radiate, usually exists in RF voltage losses in the connector, by which they are interconnected.

A solid EMI shield that completely surrounds a product can be at any potential and still provide effective EMI shielding. That is, the shield prevents outside influences from affecting circuits inside the EMI shield and vice versa. Thus, the EMI shield need not be grounded or have its voltage potential defined in any way. However, an ungrounded or undefined EMI shield should completely enclose the object being protected and that object being protected should have no connection to the outside world.

In practice, however, the EMI shield is not a complete enclosure, and the object inside does have connections to the outside world, either directly, through signal and/or power leads, or indirectly, through stray capacitance due to holes in the EMI shield. In such cases, the EMI shield should be grounded or have its voltage potential defined with respect to the noise source to prevent the noise source's potential from coupling to the enclosed object. An ungrounded or undefined EMI shield's potential varies with conditions and location, and therefore the noise coupled to the object inside also varies.

Grounding also has other benefits. Grounding provides a path for RF currents to flow on the structure. Grounding also prevents the buildup of AC potentials on the equipment enclosure. Grounding provides a fault-current return path to protect personnel from shock hazards. Grounding also prevents the buildup of static charge.

The EMI shield should have a low-impedance coupling with a voltage reference such as a ground plane of a printed circuit board in at least two places in order to properly define the voltage potential or ground the EMI shield in a computer system. However, today's computer systems include high frequency EMI sources such as processors which may require the EMI shield to be electrically coupled to a voltage reference, such as a ground plane, at several locations. The higher frequencies of these EMI sources require closer spacings between the grounding connections of the EMI shield to the voltage reference in order to provide effective EMI shielding. The spacing of these grounding connections is directly related to the desired shielding effectiveness and the upper frequency limit of the shield. One embodiment encompasses the legal requirements of the upper frequency limit of the shield to be 2000 MHz (two billion cycles per second), and to have a shielding attenuation of greater than 40 decibels (dB). These criteria are used to determine the optimum spacing of each grounding embodiment by calculation. Coupling a generally planar EMI shield at several closely spaced locations around its perimeter allows an EMI shield to form the top portion of an effective EMI shield enclosure with a ground plane forming the bottom portion. As with the PWB grounding connections, the spacing of the top perimeter connections is directly related to the desired shielding effectiveness and the upper frequency limit of the shield.

EMI shields constructed from an electrically conductive metal with a high yield strength give the shield resiliency in making electrical contact with an electrically conductive surface electrically coupled to a voltage reference such as a ground plane of a printed circuit board.

Heat distribution has also been a problem with some computers, especially with portable computers. In the past, heat spreaders, heat sinks, heat pipes, and fans have been used to address this problem. One type of heat spreader is a metal piece that is thermally coupled to a processor and distributes heat away from the processor. Typically, a heat sink is made of relatively pure aluminum for good thermal conductivity and for reduced weight. However, aluminum oxide coatings typically form on the outside of items made of aluminum which reduces the ability of the object to provide low impedance electrical connections with other items in contact with the aluminum material. Because heat spreaders typically serve only one function, heat spreaders add extra pieces to the computer system assembly as well as increasing the complexity of the build and repair operations.

Fans and heat sinks provide a cost effective mechanism for thermally managing many types of portable computer systems. Fans, however, require power and heat sinks require space. While power and space are generally in abundant supply in desktop-type minicomputers, portable computers have only a limited supply of both power and space. A commercial advantage is achieved by manufacturing portable computers that are both small and lightweight. Further, portable computers must operate with power conservation in mind. An operable fan may unduly draw upon the batteries of a laptop making it unattractive for long periods of battery-operated use.

Heat pipes are self contained, phase transformation, heat carrying devices, i.e. a superconductor of heat. A typical heat pipe may comprise a closed copper tube having a partial vacuum internally. Water in a hot portion of the tube boils at a lower than usual temperature in the partial vacuum. The boiling water seeks a cooler spot and thus steam moves to carry heat to the cooler spot where the steam condenses to cooler water which returns to the hot spot. The cycle is ongoing which provides a contained circulating system.

Therefore, what is needed is a hybrid cooling device utilizing both an active and a passive cooling method integrated with an EMI shielding device which utilizes the benefits and avoids limitations of each and, in addition, provides enhanced heat dissipation while providing effective EMI containment of an electrical component within a computer system.

SUMMARY

One embodiment, accordingly, provides hybrid cooling integrated with EMI shielding by combining cooling systems with a processor module EMI cap connected to a heat pipe. To this end, a hybrid cooling system integrated with an EMI shield includes an EMI shield member. A cap member is mounted on the EMI shield member. Means are provided for transferring heat from the cap member to a heat sink and includes a first end attached to the cap member and a second end attached to the heat sink.

A principal advantage of this embodiment is that thermally attaching a heat pipe and radiator to an electrical component EMI cap, used in combination with an EMI perimeter shield allows enhanced heat dissipation, while providing effective EMI containment. Another advantage is that the components are compatible with top down manufacturability and serviceability.

DETAILED DESCRIPTION OF THE PREFERRED EMBODIMENT

Figure 1:
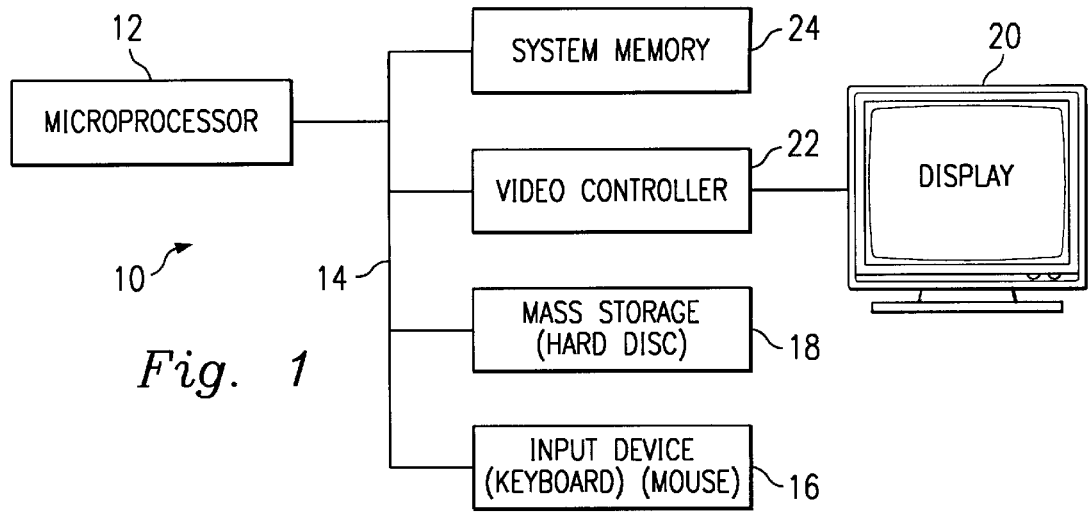
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
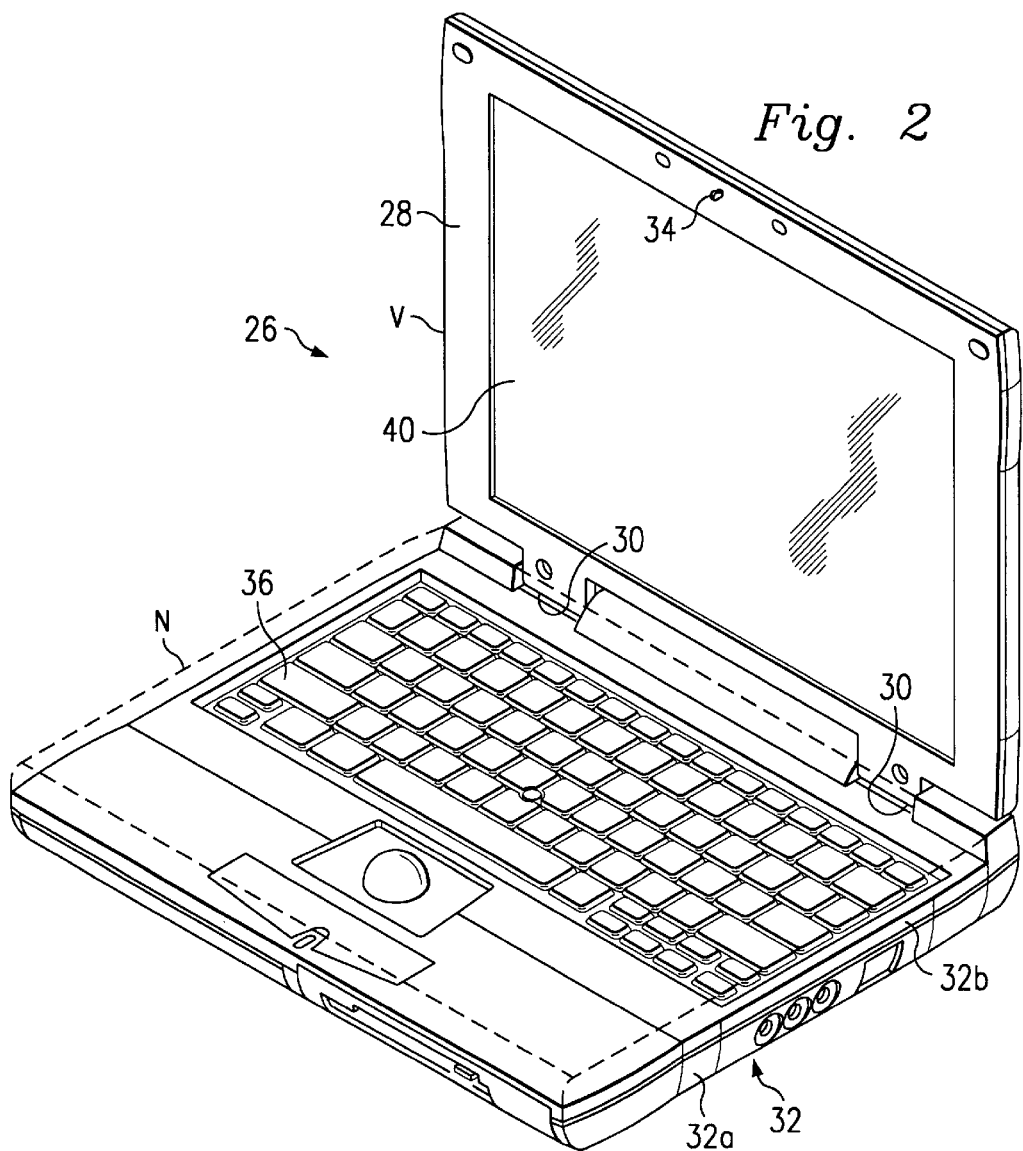
FIG. 2 is a perspective view illustrating an embodiment of a portable laptop computer.

Referring to FIG. 2, illustrated is a portable, notebook size computer designated 26 comprising a self-contained system, such as that illustrated at 10 in FIG. 1, and including a hinged top or lid 28 rotatable about a hinge or hinges 30 from a nested position "N," with a horizontal base 32, to a substantially vertical or open position "V". Opening of the notebook style portable computer by manipulation of a latch 34, reveals a plurality of keys 36 on base 32, and a monitor screen 40 mounted in lid or top 28. Base 32 includes a bottom or first member 32a and a top or second member 32b.

Figure 3:
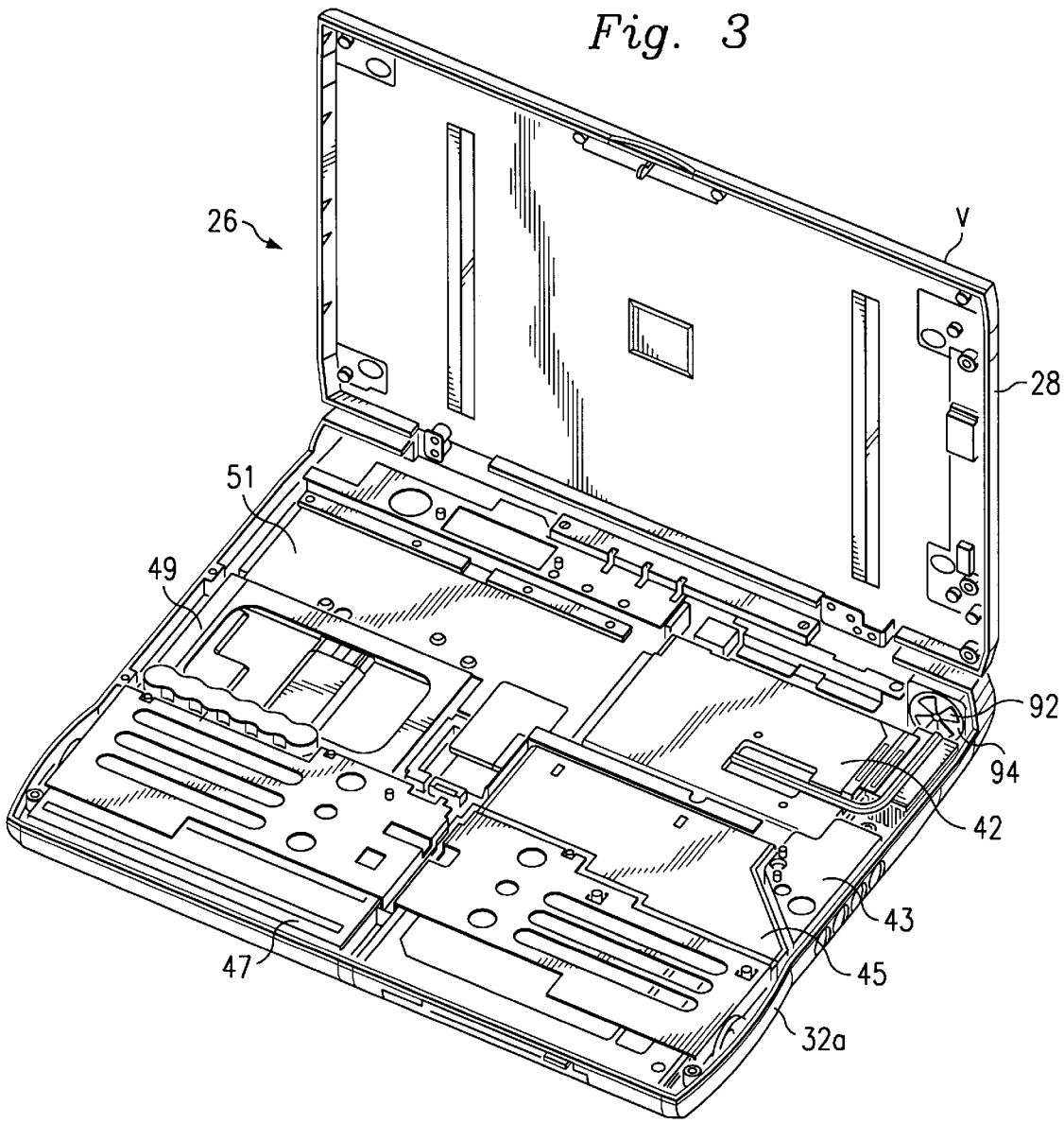
FIG. 3 is another perspective view illustrating an embodiment of a partially disassembled laptop computer.

Computer 26, FIG. 3 illustrates the first member 32a of base 32 with the second or keyboard member 32b removed thus exposing some of the components mounted in base 32. Some of the components include a hybrid cooling section 42, an audio subsection 43, a CD floppy module section 45, a battery bay section 47, a hard-disk drive section 49 and a motherboard 51. Top 28 is illustrated in the open position V and has the monitor screen 40 removed.

Figure 4:
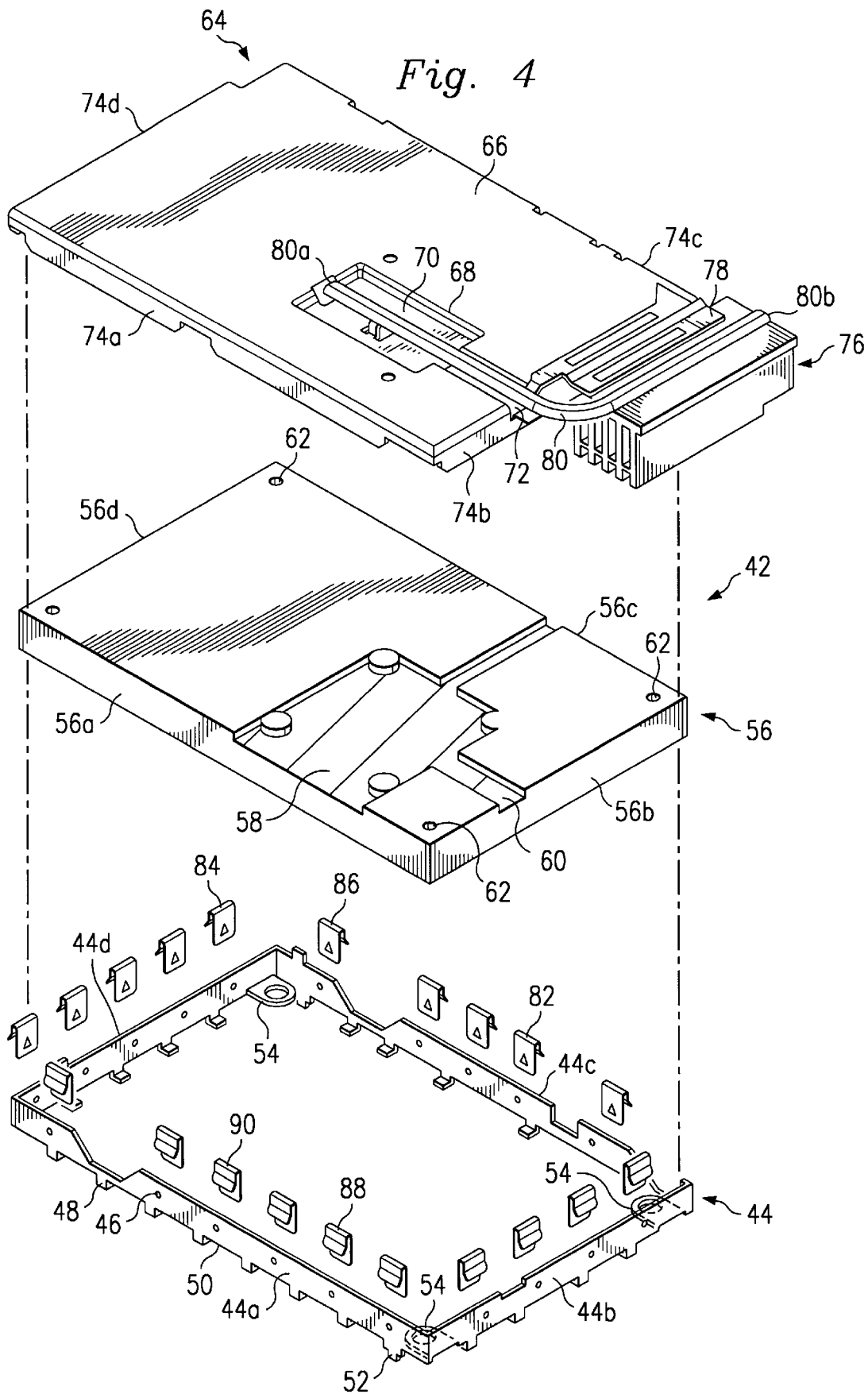
FIG. 4 is an exploded view illustrating an embodiment of a hybrid cooling system and EMI shield.

Hybrid cooling section 42, FIG. 4, comprises an electromagnetic interference shield member 44 which includes a generally rectangular fence-like or perimeter-like structure having four sides 44a, 44b, 44c and 44d. Each side 44a–44d includes features in common with each other side, therefore, only one side will be described to avoid repetition. Side 44a includes a planar wall having a plurality of holes 46 formed therein and a plurality of tabs 48 extending from a surface 50 thereof. A locator leg 52 also extends from surface 50. Three of the four corners of shield member 44 include threaded receivers 54.

A processor module 56, includes a plurality of sides 56a, 56b, 56c, 56d, a hot plate section 58, a groove 60 and a plurality of screw holes 62. A heat spreader cap 64 includes a heat spreader surface 66, an indentation 68 including a planar portion 70, and a groove 72 formed therein. Four planar sides 74a, 74b, 74c, 74d, extend from heat spreader surface 66.

A heat sink 76 is attached to heat spreader cap 64 by means of a heat sink support member 78 suitably adhered to cap 64 and heat sink 76. Heat sink 76 is also physically connected to cap 64 by means of a heat pipe 80 which is attached at a first end 80a, to the planar portion 70 in the indentation 68 by a suitable adhesive, and is attached at a second end 80b, to heat sink 76 by a suitable adhesive.

A plurality of spring clips 82 may optionally be used to fit over sides 44a–44d such that a protrusion 84 on a first portion 86 of clip 82 retentively engages a respective hole 46 of sides 44a–44d, and a spring lip 88 on a second portion 90 of clip 82 is positioned to resiliently receive sides 74 of cap 64 and to provide a compliant EMI contact between cap 64 and shield 44. EMI contact is defined as allowing RF electrical current to pass through all hybrid cooler interfaces with a low resistance, typically on the order of less than 10 milliohms. Specifically, low resistance EMI contact is achieved at the interfaces of all cap heat spreader sides 74a, 74b, 74c, 74d, the spring clips 82, the shield 44, the heat sink 76, and the heat pipe 80.

Figure 5:
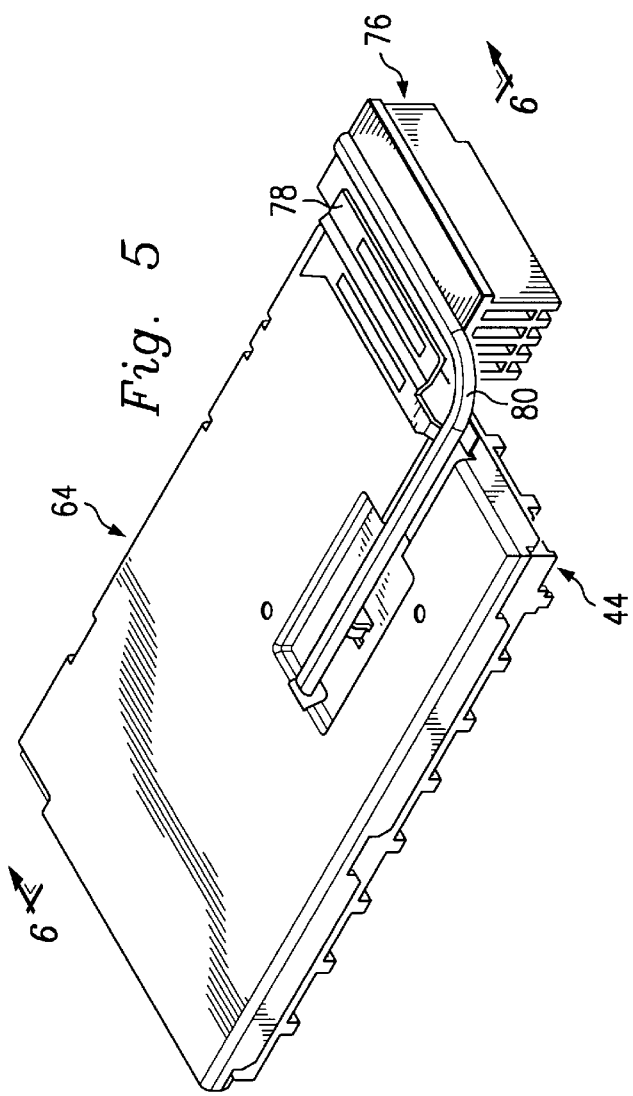
FIG. 5 is a perspective view illustrating an embodiment of an assembled hybrid cooling system and EMI shield.
Figure 6:
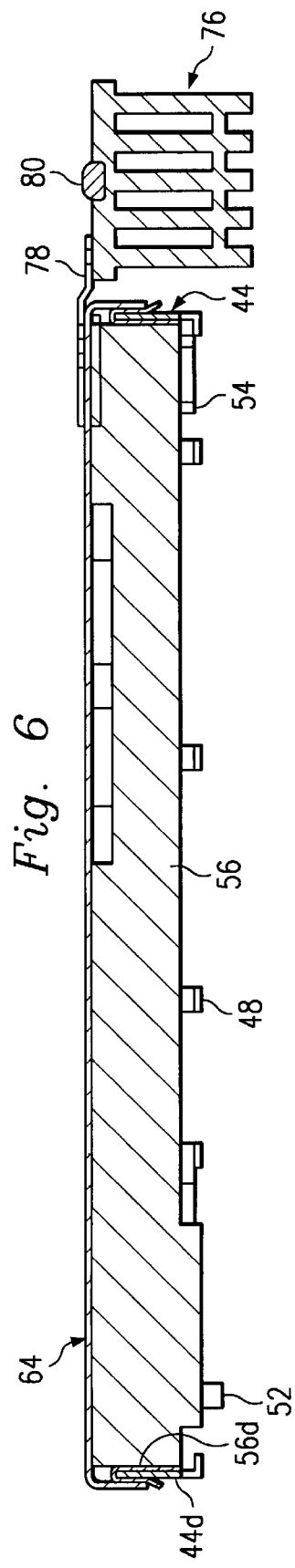
FIG. 6 is a cross-sectional side view of the hybrid cooling system viewed from the line 6—6 of FIG. 5.

Cap 64, FIG. 5, is pre-assembled with heat sink 76 interconnected by heat sink support member 78 and heat pipe 80. The processor module 56 is mounted within shield member 44 so that sides 44a -44d respectively engage one of the processor module sides 56a–56d. Processor module 56, FIG. 6 seats on threaded receivers 54 so that holes 62, FIG. 4, align with receivers 54. Screws, not shown, secure processor module 56 to shield member 44 while providing low resistance EMI contact between all serial interfaces of module 56, receivers 54, screw holes 62 and shield member 44. The shield member 44 is located on motherboard 51, FIG. 3 by locating legs 52 engaging specifically positioned holes in motherboard 51. Also tabs 48 of shield member 44 are soldered to motherboard 51 providing low resistance EMI contact between all soldered interfaces of shield member 44, locator tabs 48, legs 52, and the motherboard 51.

The assembly including cap 64, FIG. 5, heat sink 76, heat sink support 78 and heat pipe 80 is seated with processor module 56 and shield member 44. Spring lips 88, FIG. 4, of clips 82 are compressed between sides 44a–44d of shield member 44 and sides 74a–74d of heat spreader cap 64 for retaining heat spreader cap 64 on shield member 44 and providing compliant EMI contact.

In operation, heat generated from processor module 56 is passively transferred to heat spreader cap 64 through contact between hot plate section 58 and planar portion 70 of indentation 68. Some of the heat is spread to heat spreader surface 66 and some of the heat is moved to heat sink 76 by heat pipe 80. One or more thermal trip points (not shown) in chassis base 32 are controlled by the system BIOS to automatically actuate a fan 92 mounted in a fan duct 94 in base 32. Operation of fan 92 draws cooling air across the heat sink 76 to actively carry heat away from the heat sink 76.

As it can be seen, the principal advantages of these embodiments are that an electrical component is mounted on a motherboard within an EMI perimeter shield.

A heat spreader cap is mounted over the electrical component and EMI perimeter shield. A heat sink is attached to the heat spreader cap and a heat pipe thermally interconnects the heat spreader cap and the heat sink. A fan, mounted adjacent the heat sink, draws cooling air over the heat sink.

With regard to RF ground referencing, the processor module 56 has improved ground references at its mounting locations due to the low inductance of the overall shield 44, sides 74a, 74b, 74c, 74d, heat spreader cap 64, and ground planes in the motherboard 51. This reduces ground bounce on the processor module 56, one source mechanism of radiated emissions, while also providing an equal potential, low resistance ground reference for all mounting points on the processor.

With regard to RF ground nulling, the inductive loses inherent in the processor module 56 to motherboard 51 connector, produces radiated fields when energized at typical processor operating speeds. This source of radiated emissions is minimized due to the RF ground nulling that occurs due to the close proximity and low inductance of fence component sides 44a, 44b, 44c, 44d, the shield sides 74a, 74b, 74c, 74d, of cap 64, the mounting screws and receivers 54, ground locator legs 52, and multiple ground tabs 48. These and other components also serve the function of shielding the radiated fields from this connector.

RF shielding is accomplished through the combined effects of absorbing and reflecting the source radiated fields. These fields exist at many frequencies, or wavelengths, and a certain thickness of metal is required to shield a certain wavelength by a specific amount. The specific amount of shielding that is desired is referred to as Shielding Effectiveness, and is expressed in dB. The thickness of metal required to absorb a specific wavelength or frequency is referred to as skin depth. Absorbed RF waves are dissipated as heat in the multiple paths provided by the integrated cooler.

One embodiment requires the minimum frequency desired to cut off, to be 10 Mhz (10 Million cycles per second), another requires the minimum frequency to be 450 KHz (450 thousand cycles per second). The minimum skin depth is calculated as a minimum metal thickness for the perimeter like shield member 44, the multiple spring clips 82, the sides 74a, 74b, 74c, 74d, the cap 64, and/or the ground planes in the motherboard 51.

With regard to EMI noise sources, the perimeter like shield member 44, the multiple spring clips 82, the four sides 74a, 74b, 74c, 74d, the cap 64, and the ground planes in the motherboard 51 are the primary parts that shield the noise sources both internal and external to the hybrid cooler.

The noise source includes the processor module 56, the processor board traces, the processor board components, the connector to the motherboard 51, the motherboard power planes, integrated circuits on the motherboard, routed circuitry on the motherboard, and components on the motherboard.

As such, one embodiment provides a hybrid cooling system integrated with an EMI shield. The EMI shield has a cap member mounted thereon. A heat sink is connected to the cap member and a heat pipe has a first end attached to the cap member and a second end attached to the heat sink.

Another embodiment provides a computer system including a chassis and a microprocessor mounted in the chassis. An input is coupled to provide input to the microprocessor. A mass storage is coupled to the microprocessor. A display is coupled to the microprocessor by a video controller. A memory is coupled to provide storage to facilitate execution of computer programs by the microprocessor. A motherboard is mounted in the chassis and an EMI shield is mounted on the motherboard. A processor module is mounted in engagement with the EMI shield. A cap is mounted on the processor module and is engaged with the EMI shield. A heat sink is connected to the cap and a heat pipe has a first end attached to the cap and a second end attached to the heat sink.

A further embodiment provides a hybrid cooling system for a computer and includes a chassis having an electrical component mounted thereon. An active cooling portion and a passive cooling portion are interconnected and are mounted on the chassis. The passive cooling portion includes a heat spreader cap mounted adjacent the electrical component and a heat pipe having a first end connected to the heat spreader cap. The active cooling portion includes a heat sink attached to the heat spreader cap and a fan positioned for drawing air across the heat sink. A second end of the heat pipe is connected to the heat sink.

A still further embodiment provides a method for cooling an electrical component mounted in a computer chassis. A processor module is mounted within an EMI shield on a motherboard in the chassis. A heat spreader cap is mounted in the processor module and the EMI shield. A heat sink is attached to the heat spreader cap. A first end of a heat pipe is attached to the heat spreader cap and a second end of the heat pipe is attached to the heat sink. A fan is mounted in the chassis adjacent the heat sink for drawing cooling air across the heat sink.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A hybrid cooling system integrated with an EMI shield, comprising:

an electrical component;

an EMI shield member;

a cap member mounted on the electrical component and the EMI shield member;

a heat sink mounted adjacent to the cap member;

means for transferring heat from the cap member to the heat sink, said means having a first end attached to the cap member and a second end attached to the heat sink;

the cap member including an indentation formed therein, the means for transferring heat being a heat pipe having the first end mounted in the indentation; and the indentation including a planar surface adjacent the electrical component.

2. The cooling system as defined in claim 1 wherein the EMI shield member is a perimeter shield.

3. The cooling system as defined in claim 1 further comprising a heat sink support member interconnecting the cap member and the heat sink.

4. A computer system comprising:

a chassis;

a microprocessor mounted in the chassis;

an input coupled to provide input to the microprocessor;

a mass storage coupled to the microprocessor;

a display coupled to the microprocessor by a video controller;

a memory coupled to provide storage to facilitate execution of computer programs by the microprocessor;

a motherboard mounted in the chassis;

an EMI shield member mounted on the motherboard;

a processor module mounted in engagement with the EMI shield member;

a cap member mounted on the processor module and engaged with the EMI shield member;

a heat sink connected to the cap member;

a heat pipe having a first end attached to the cap member and a second end attached to the heat sink;

the cap member including an indentation formed therein, the first end of the heat pipe being mounted in the indentation; and the indentation including a planar surface adjacent the processor module.

5. The computer system as defined in claim 4 further comprising a fan mounted in the chassis adjacent the heat sink, whereby the fan is positioned to draw air across the heat sink.

6. A hybrid cooling system for a computer comprising:

a chassis;

an electrical component mounted in the chassis;

an active cooling portion mounted in the chassis;

a passive cooling portion mounted in the chassis, the active and passive cooling portions being connected;

the passive cooling portion including a heat spreader cap mounted adjacent the electrical component and a heat pipe having a first end connected to the heat spreader cap;

the active cooling portion including a heat sink attached to the heat spreader cap and a fan positioned for drawing air across the heat sink;

the heat pipe having a second end connected to the heat sink;

the heat spreader cap including an indentation formed therein, the first end of the heat pipe being mounted in the indentation; and the indentation including a planar surface adjacent the electrical component.

7. A hybrid cooling system for a computer comprising:

a chassis;

an electrical component mounted in the chassis;

an active cooling portion mounted in the chassis;

a passive cooling portion mounted in the chassis, the active and passive cooling portions being connected;

the passive cooling portion including a heat spreader cap mounted adjacent the electrical component and a heat pipe having a first end connected to the heat spreader cap;

the active cooling portion including a heat sink attached to the heat spreader cap and a fan positioned for drawing air across the heat sink;

the heat pipe having a second end connected to the heat sink;

an EMI perimeter shield engaged with peripheral edges of the electrical component; and resilient clips mounted on the EMI shield for resiliently engaging the heat spreader cap and providing compliant EMI contact between the cap and the shield.

8. The method as defined in claim 7 further comprising the step of interconnecting the heat sink and the heat spreader cap with a heat sink support member.

9. A method for cooling an electrical component mounted in a computer chassis comprising the steps of:

mounting an EMI shield on a motherboard in the chassis;

mounting a processor module within the EMI shield;

mounting a heat spreader cap including an indentation formed therein, on the processor module and EMI shield, the indentation having a planar surface adjacent the processor module;

attaching a heat sink to the heat spreader cap;

attaching a first end of a heat pipe to the indentation in the heat spreader cap;

attaching a second end of the heat pipe to the heat sink; and mounting a fan in the chassis adjacent the heat sink for drawing cooling air across the heat sink.

10. The method as defined in claim 9 further comprising the step of attaching the first end of the heat pipe to the indentation.

11. The method as defined in claim 9 further comprising the step of attaching the EMI shield to peripheral edges of the processor module.

12. A hybrid cooling system integrated with an EMI shield, comprising:

an electrical component;

an EMI shield member engaged with peripheral edges of the electrical component;

a cap member mounted on the electrical component and the EMI shield member;

a heat sink mounted adjacent to the cap member;

means for transferring heat from the cap member to the heat sink, said means having a first end attached to the cap member and a second end attached to the heat sink; and resilient clips mounted on the EMI shield for resiliently engaging the cap member and providing compliant EMI contact between the cap member and the EMI shield member.

13. A computer system comprising:

a chassis;

a microprocessor mounted in the chassis;

an input coupled to provide input to the microprocessor;

a mass storage coupled to the microprocessor;

a display coupled to the microprocessor by a video controller;

a memory coupled to provide storage to facilitate execution of computer programs by the microprocessor;

a motherboard mounted in the chassis;

an EMI shield member mounted on the motherboard;

a processor module mounted in engagement with the EMI shield member;

a cap member mounted on the processor module and engaged with the EMI shield member;

a heat sink connected to the cap member;

a heat pipe having a first end attached to the cap member and a second end attached to the heat sink; and resilient clips mounted on the EMI shield member for resiliently engaging the cap member and providing compliant EMI contact between the cap member and the EMI shield member.

* * * * *

UNITED STATES PATENT AND TRADEMARK OFFICE
CERTIFICATE OF CORRECTION

PATENT NO. : 6,122,167
DATED : September 19, 2000
INVENTOR(S) : Russell Smith, Mark B. Penniman and Todd Steigerwald It is certified that error appears in the above-identified patent and that said Letters Patent is hereby corrected as shown below:

<u>Column 8,</u>
Line 35, should be -- 9 -- and should depend from 8.
Line 38, should be -- 8 -- which is an independent claim.
Lines 53 and 56, after "claim", delete "9", and insert -- 8 --.

Signed and Sealed this

First Day of July, 2003

JAMES E. ROGAN
*Director of the United States Patent and Trademark Office*